(12) United States Patent
Bang et al.

(10) Patent No.: US 7,011,710 B2
(45) Date of Patent: Mar. 14, 2006

(54) CONCENTRATION PROFILE ON DEMAND GAS DELIVERY SYSTEM (INDIVIDUAL DIVERT DELIVERY SYSTEM)

(75) Inventors: Won Bang, Santa Clara, CA (US); Yen Kun Wang, Fremont, CA (US); Yeh Jen Kao, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 809 days.

(21) Appl. No.: 09/832,168

(22) Filed: Apr. 10, 2001

(65) Prior Publication Data
US 2002/0000195 A1 Jan. 3, 2002

Related U.S. Application Data
(60) Provisional application No. 60/195,900, filed on Apr. 10, 2000.

(51) Int. Cl.
C23C 16/00 (2006.01)
C23F 1/00 (2006.01)
H01L 21/306 (2006.01)

(52) U.S. Cl. ................. 118/715; 118/726; 118/724; 156/345.37

(58) Field of Classification Search ............ 118/726, 118/715, 50, 52, 689; 432/47; 438/680; 427/250
See application file for complete search history.

(56) References Cited

U.S. PATENT DOCUMENTS

| | | | | |
|---|---|---|---|---|
| 4,263,091 A | * | 4/1981 | King ................... 159/44 |
| 4,640,221 A | * | 2/1987 | Barbee et al. ........... 118/689 |
| 4,761,269 A | | 8/1988 | Conger et al. |
| 5,620,524 A | * | 4/1997 | Fan et al. ............... 118/726 |
| 5,690,743 A | * | 11/1997 | Murakami et al. ....... 118/715 |
| 5,730,804 A | * | 3/1998 | Gomi et al. ............ 118/726 |
| 5,804,259 A | * | 9/1998 | Robles ................ 427/577 |
| 5,849,089 A | * | 12/1998 | Tsunashima et al. ..... 118/726 |
| 6,007,330 A | * | 12/1999 | Gauthier .............. 432/47 |
| 6,132,515 A | * | 10/2000 | Gauthier .............. 118/715 |
| 6,178,925 B1 | * | 1/2001 | Sturm et al. ........... 122/390 |
| 6,179,925 B1 | * | 1/2001 | Schmitt et al. ......... 118/726 |
| 6,258,735 B1 | | 7/2001 | Xia et al. ............. 438/788 |
| 6,435,229 B1 | * | 8/2002 | Noah et al. ........... 141/231 |
| 6,454,860 B1 | * | 9/2002 | Metzner et al. ........ 118/715 |
| 2002/0123221 A1 | * | 9/2002 | Jost et al. ............ 438/680 |

* cited by examiner

Primary Examiner—Rudy Zervigon
(74) Attorney, Agent, or Firm—Patterson & Sheridan

(57) ABSTRACT

Apparatus and method for delivering processing gas are provided. The apparatus for delivering processing gas from a vaporizer to a processing system comprises: a valve connected between the vaporizer and the processing system, the valve having a valve input connected to a vaporizer output and a first valve output connected to a processing system input and a second valve output connected to a bypass line; and a controller for switching the valve between the first valve output and the second valve output. The apparatus may further comprise: a second valve connected between a carrier gas source, a divert gas source and the vaporizer, the second valve having a first valve input connected to the carrier gas source, a second valve input connected to the divert gas source, and a valve output connected to a vaporizer input.

10 Claims, 4 Drawing Sheets

CONCENTRATION PROFILE ON DEMAND GAS DELIVERY SYSTEM (INDIVIDUAL DIVERT DELIVERY SYSTEM)

This application claims benefit of U.S. provisional patent application Ser. No. 60/195,900, filed on Apr. 10, 2000, which is herein incorporated by reference.

BACKGROUND OF THE INVENTION

1. Field of the Invention

The invention generally relates to a gas delivery system. More particularly, the invention relates to a gas delivery system having one or more vaporizers that provide process gases on demand for substrate processing systems.

2. Background of the Related Art

In the production of integrated circuits, many processing methods require one or more reactive chemicals or precursors to be deposited onto a substrate in an atmospherically-controlled heated reactor or chamber. The precursors typically are converted from a solid or liquid state into a gaseous or vapor state to achieve a high degree of uniformity by vapor deposition. The precursor vapor, once generated, is directed into a reaction chamber and forms a deposited layer on the substrate. This process is typically called chemical vapor deposition or "CVD". The deposited precursor chemical may form fine crystalline or amorphous layers which are required for creating microcircuits on the substrate.

In CVD processing systems, liquid precursors are typically delivered through a liquid flow meter to a vaporizer or bubbler which heats the liquid precursor into a vapor phase. The liquid precursors may be combined with a solvent to enhance the vaporization process. A carrier gas is also introduced into the vaporizer for carrying vaporized precursor molecules in the vapor phase to the processing chamber. The quantity and concentration of precursor introduced into the chamber is dependent on the flow of the carrier gas as well as the amount of precursor introduced into the vaporizer.

PLIS (precision liquid injection system), EPLIS and Parallel GPLIS have been developed to deliver vaporized liquid precursors to dielectric deposition chambers for deposition processes utilizing multiple liquid precursors, such as BPSG (borophosphosilicate glass), PSG (phosphosilicate glass or phosphorus-doped silicon oxide film), BSG (borosilicate glass or boron-doped silicon oxide film) or USG (undoped silicate glass or undoped silicon oxide film) processes.

Typically, the flow of the liquid precursor into the vaporizer is controlled by a liquid flow meter (LFM). The response time of the vapor supply into the chamber typically depends on the LFM PID (proportional-integral-differential) control, the liquid vaporizer control valve (injection valve) set up, liquid flow rate, liquid supply pressure, carrier gas flow rate, chamber pressure and etc. For a properly tuned liquid injection system, the response time before stable process gas flow in the chamber is reached typically ranges from about six to ten seconds.

FIG. 1 is a graphical illustration showing the standard flow response of vaporized liquid of a typical liquid injection system. The transient state due to the inherent rise time effect of the LFM is indicated by rise time, before liquid stabilizes to set point flow varies from liquid to liquid and from chamber to chamber. The transient film property at the film interface where film starts to grow can not be controlled and results in uncontrolled and inconsistent dopant concentration.

One example of a problem due to transient film properties is formation of voids at the interface of a BPSG layer and a nitride layer. Another example of a problem due to transient film properties is the consumption of nitride during anneal steps which occurs when a high phosphor content in the initial BPSG film in reaction with water vapors from a steam anneal process causes consumption of nitride by phosphoric acid. Inconsistent dopant concentration, particularly at interfaces with other materials, results in inconsistent processing and defective device formations.

This transient film property becomes even more significant when the deposition process is short as compared to the time for stabilizing process gas flow. For example, if a process requires a dopant to be introduced for about 12 seconds into the chamber, a majority of the doping process (i.e., about 6–10 seconds) will be required to stabilize the process gas flow, which may vary each time the process is performed, resulting in inconsistent and unrepeatable processing.

Therefore, there is a need for a process gas delivery system that improves dopant concentration control, particularly at film interfaces. More specifically, there is a need for accurate control of a vaporized liquid supply.

SUMMARY OF THE INVENTION

Process gas delivery system and method for improving dopant concentration control, particularly at film interfaces, are provided. More specifically, method and apparatus for providing accurate control of vaporized liquid supply are provided.

One aspect provides an apparatus for delivering processing gas from a vaporizer to a processing system. The apparatus comprises: a valve connected between the vaporizer and the processing system, the valve having a valve input connected to a vaporizer output and a first valve output connected to a processing system input and a second valve output connected to a bypass line; and a controller for switching the valve between the first valve output and the second valve output. Preferably, the apparatus further comprises: a second valve connected between a carrier gas source, a divert gas source and the vaporizer, the second valve having a first valve input connected to the carrier gas source, a second valve input connected to the divert gas source, and a valve output connected to a vaporizer input.

Another aspect provides a method for delivering processing gas from a vaporizer to a processing system comprising: connecting a valve between the vaporizer and the processing system, the valve having a valve input connected to a vaporizer output and a first valve output connected to a processing system input and a second valve output connected to a bypass line; and selectively switching the valve between the first valve output and the second valve output.

Another aspect provides an apparatus for processing a substrate, comprising: a chamber having a gas input; a vaporizer; a valve connected between the vaporizer and the chamber, the valve having a valve input connected to a vaporizer output and a first valve output connected to the chamber gas input and a second valve output connected to a bypass line; and a controller for switching the valve between the first valve output and the second valve output. Preferably, the apparatus further comprises a second valve connected between a carrier gas source, a divert gas source and the vaporizer, the second valve having a first valve input connected to the carrier gas source, a second valve input connected to the divert gas source, and a valve output connected to a vaporizer input.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
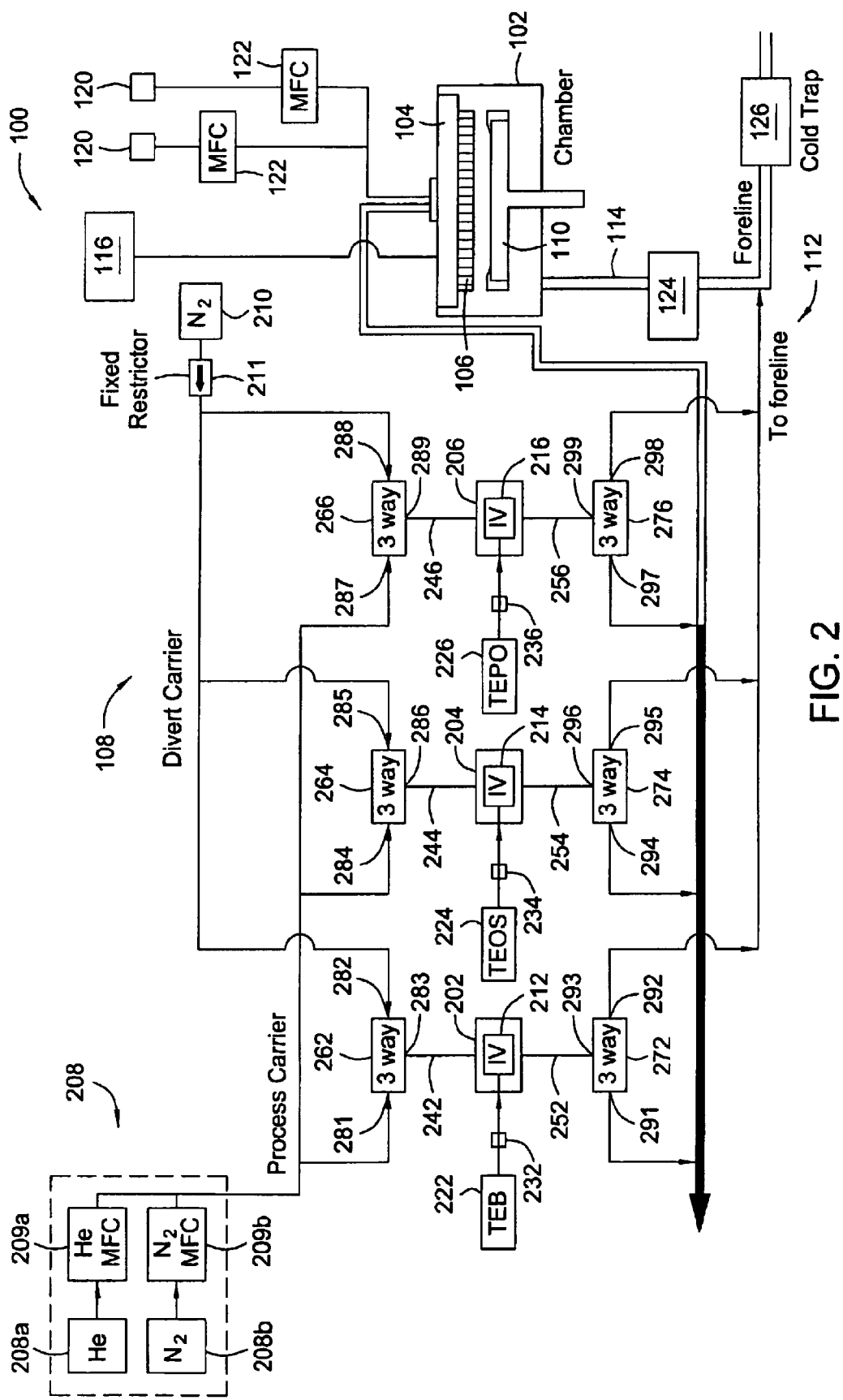
FIG. 2 is a schematic illustration showing a chemical vapor deposition system having one embodiment of an individual divert gas delivery system.

FIG. 2 is a schematic illustration showing a chemical vapor deposition system having one embodiment of an individual divert gas delivery system. Generally, the chemical vapor deposition (CVD) system 100 includes a chamber 102, a chamber lid 104 having a gas distributor 106, a gas delivery system 108 fluidly connected to the gas distributor 106 to deliver one or more processing gases into the chamber 102, a substrate support member 110 disposed in the chamber, a vacuum exhaust system 112 connected to a gas outlet 114 of the chamber 102, and a system controller 116 connected to control operation of the CVD system 100. Examples of CVD systems include the Ultima HDP-CVD™ chamber/system and the DxZ™ chamber/system, which are available from Applied Materials, Inc., located in Santa Clara, Calif.

The substrate support member 110, typically made of a ceramic or aluminum nitride (AlN), includes a heater, such as a resistive heating coil disposed inside the substrate support member, and may also include substrate chucking mechanisms for securely holding a substrate, such as a vacuum chuck or an electrostatic chuck. The gas distributor 106 may comprise a showerhead type gas distributor or a plurality of injection nozzles, for providing a uniform process gas distribution over a substrate disposed on the substrate support member 110. A temperature control system, such as a resistive heating coil and/or thermal fluid channels, may be disposed in thermal connection with the lid and the gas distributor 106. The temperature control system maintains the temperature of the gas distributor 106 within a desired range throughout processing. The gas distributor 106 is fluidly connected to the gas delivery system 108. The gas distributor 106 may also be fluidly connected to additional gas sources 120 through additional MFCs 122.

The exhaust system 112 includes one or more vacuum pumps 124, such as a turbomolecular pump, connected to exhaust gases from and maintain vacuum levels in the chamber 102. The one or more vacuum pumps 124 are connected to the exhaust or gas outlet 114 through a valve such as a gate valve. One or more cold traps 126 are disposed on exhaust lines to remove or condense particular gases exhausted from the chamber.

The gas delivery system 108 includes one or more vaporizers connected to one or more liquid precursor sources for forming the desired film on the substrate in the chamber. FIG. 2 schematically illustrates one embodiment of a gas delivery system 108 having three vaporizers 202, 204, 206 for vaporizing three liquid precursors. Although this embodiment is described utilizing three vaporizers, it is understood that the invention contemplates other embodiments of the gas delivery system utilizing any number of vaporizers. Each vaporizer 202, 204, 206 includes an injection valve 212, 214, 216 connected to a liquid precursor source 222, 224, 226 which supplies the liquid precursor to be vaporized. The liquid precursor sources 222, 224, 226 may include one or more ampules of precursor liquid and solvent liquid. Each ampule is connected to the injection valve of the vaporizer through a liquid flow meter (LFM) 232, 234, 236. Optionally, a shut-off valve is disposed between each LFM and each vaporizer.

Each vaporizer 202, 204, 206 includes a carrier gas input 242, 244, 246 and a gas output 252, 254, 256. As shown in FIG. 2, each vaporizer includes an input valve 262, 264, 266 connected the carrier gas input 242, 244, 246 of the vaporizers and an output valve 272, 274, 276 connected to the gas output 252, 254, 256 of the vaporizers. The input and output valve preferably comprises three-way valves to provide substantially instantaneous switching (i.e., less than about 10 milliseconds) between valve inputs and between valve outputs. The input valve 262, 264, 266 facilitates selection between sources of carrier gas and includes a first input 281, 284, 287 connected to a process carrier gas source 208 and a second input 282, 285, 288 connected to a divert carrier gas source 210. The output 283, 286, 289 of the input valve 262, 264, 266 is connected to the carrier gas input 242, 244, 246 of the vaporizer 202, 204, 206. The input valve 262, 264, 266 is connected to and controlled by the system controller 116 to switch between the input connections 281/282, 284/285, 287/288 as described below.

The output valve 272, 274, 276 includes an input 293, 296, 299 connected to the vaporized gas output 252, 254, 256 of the vaporizer 202, 204, 206 and facilitates selective delivery of process gas to the chamber. The output valve 272, 274, 276 includes a first output 291, 294, 297 connected to the gas distributor 106 of the chamber and a second output 292, 295, 298 connected to a foreline of the exhaust system 112 of the processing system. The output valve 272, 274, 276 is connected to and controlled by the system controller 116 to switch between the output connections 291/292, 294/295, 297/298 as described below.

As shown in FIG. 2, the process carrier gas source 208 includes a helium (He) gas source 208a and a nitrogen ($N_2$) gas source 208b, each of which is connected through a mass flow controller (MFC) 209a, 209b to the first input 281, 284, 287 of each input valve 262, 264, 266. The MFCs 209a, 209b are connected and controlled by the system controller 116 to provide a desired quantity of process carrier gas flowing through the vaporizers into the process chamber. For example, the MFCs 209a, 209b can be set to provide a total of 6 slm (standard liter per minute) of process carrier gas (e.g., total combined helium gas at 4 slm and nitrogen gas at 2 slm) into the chamber.

The divert carrier gas source 210 is connected through a fixed flow restrictor 211 which provides a desired amount of divert carrier gas to the second input 282, 285, 288 of each input valve 262, 264, 266. The fixed flow restrictor 211 provides sufficient divert carrier gas to facilitate vaporization of liquid precursors when the vaporizers 262, 264, 266 are operating in the divert mode as discussed below. Alternatively, the divert carrier gas source can be connected through a MFC to the second input of each input valve to control the amount of divert carrier gas supplied to the vaporizers. As shown in FIG. 2, the divert carrier gas source 210 includes a nitrogen gas source. Although the invention is described utilizing helium and/or nitrogen as carrier gases (process or divert) for the vaporizers, the invention contemplates utilization of a variety carrier gases, including helium, nitrogen, argon, krypton, xenon, and combinations thereof.

Although the following describes operation of the gas delivery system with respect to one vaporizer, it is understood that other vaporizers of the processing system may also operate similarly. The input valve 262 and output valve 272 connected to the vaporizer 202 operate synchronously to switch input and output of the vaporizer 202 between a process mode and a divert mode. To begin a vaporization process, the LFM 232 is opened to allow flow from the liquid precursor source 222 into the injection valve 212 of the vaporizer 202. As the liquid precursor is introduced into the injection valve 21 of the vaporizer 202, the input valve 212 of the vaporizer 202 is switched to receive carrier gas from the second input 282 which is connected to the divert carrier gas source 210. At the same time, the output valve 272 of the vaporizer 202 is switched to the second output 292 to direct vaporizer output to the foreline of the exhaust system 112. In this embodiment, when the input valve 262 is set to the second input 282 and the output valve 272 is set to the second output 292, the vaporizer 202 is defined as operating in a divert mode. Because the LFM 232 has an inherent delay (i.e., rise time) before liquid flow through the LFM is stabilized, the vaporizer 202 operates in the divert mode until the liquid flow through the LFM has stabilized, and the vaporized gas output from the vaporizer is diverted to the foreline of the exhaust system during this initial vaporization period. Thus, the process gas is not introduced into the chamber during this initial period because the process gas has a concentration gradient caused by the rise time of the LFM, and the deposited film formed subsequently on a substrate in the chamber does not exhibit concentration profiles reflecting the rise time of the LFM.

Once the liquid flow through the LFM has stabilized, the input valve 262 of the vaporizer 202 is switched to receive carrier gas from the first input 281 which is connected to the process carrier gas source 208, and the output valve 272 of the vaporizer 202 is switched to the first output 291 to direct vaporizer output to the gas distributor 106 of the chamber 102. In this embodiment, when the input valve 262 is set to the first input 281 and the output valve 272 is set to the first output 291, the vaporizer 202 is defined as operating in a process mode. In the process mode, the vaporizer 202 provides a stabilized quantity of vaporized precursor, and the resulting deposited film exhibits a consistent concentration profile.

Figure 3:
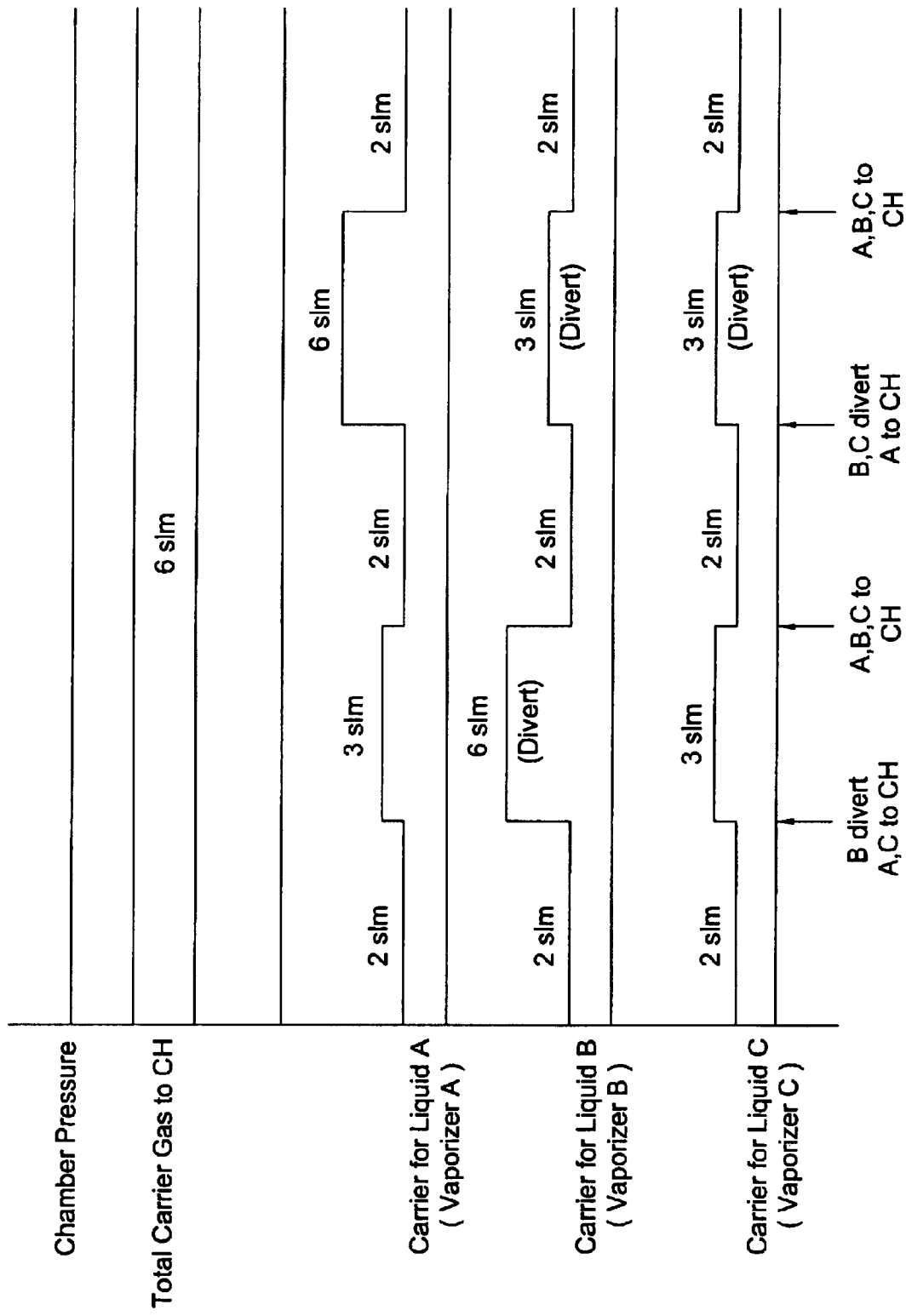
FIG. 3 is a graphical illustration of carrier gas flow and chamber pressure for a deposition process.

FIG. 3 is a graphical illustration of carrier gas flow and chamber pressure for a deposition process. As shown in FIG. 3, the invention provides a constant chamber pressure with constant process carrier gas flow into the chamber. The process carrier gas source is controlled by one or more MFCs to provide a constant 6 slm process carrier gas flow while the divert carrier gas flow is restricted by a fixed flow restrictor to provide 6 slm of divert carrier gas flow.

During a first period, each input valve of each vaporizer is switched to the first input to receive carrier gas from the process carrier gas source, and each output valve of each vaporizer is switched to the first output to direct vaporizer output into the chamber. The vaporizers are operating at processing mode, and the carrier gas flowing through each vaporizer and into the chamber is equally divided at 2 slm. No divert carrier gas flows through any vaporizer during this first period.

During a second period, vaporizers A and C remain in processing mode while vaporizer B is switched to divert mode. Vaporizer B is switched to the second input to receive carrier gas from the divert carrier gas source at 6 slm, and the vaporizer output from vaporizer B is diverted to the foreline of the exhaust system. Vaporizers A and C receive carrier gas from the process carrier gas source at 3 slm each because vaporizer B has switched its input to the divert carrier gas source. During the second period, a liquid precursor B, such as a dopant, may be introduced into the vaporizer for liquid precursor B by opening the LFM that controls flow of liquid precursor B. Preferably, the duration of the second period is sufficiently long for stabilization of the liquid precursor flow and vaporization. The concentration gradient of the vaporized precursor B due to the rise time of the LFM is thus eliminated from processing in the chamber because the vaporizer output during the rise time of the LFM is diverted to the foreline of the exhaust system.

During a third period, vaporizer B is switched back to process mode to receive carrier gas from the process carrier gas source through the first input of the input valve and to direct vaporizer output into the chamber through the first output of the output valve. Since vaporization of liquid precursor B is stabilized during the second period, the processing gas in the chamber is changed substantially instantaneously by switching the first and second valves of vaporizer B from divert mode to process mode. During the third period, the carrier gas is equally distributed among the vaporizers at 2 slm each.

During a fourth period, vaporizer A remains in process mode while vaporizers B and C are switched to divert mode. The process carrier gas source is input solely into vaporizer A at 6 slm and directed into the chamber. Vaporizers B and C receive carrier gas from the divert carrier gas source at 3 slm each, and the output from vaporizers B and C are diverted to the foreline of the exhaust system. During the fourth period, liquid precursor C, such as another dopant, may be introduced into vaporizer C for stabilizing vaporization of liquid precursor C before introducing vaporized precursor C into the chamber. Also during this period, the amount of liquid precursor B may also be changed and stabilized.

During a fifth period, all vaporizers are again operating at process mode as in the first and third period. The process gas introduced into the chamber includes stabilized concentrations of each liquid precursor. Thus, the invention provides selective switching of processing gas from any combination of vaporizer outputs while maintaining constant chamber pressure and precisely controlled precursor (i.e., dopant) concentration.

EXAMPLE

Figure 1:
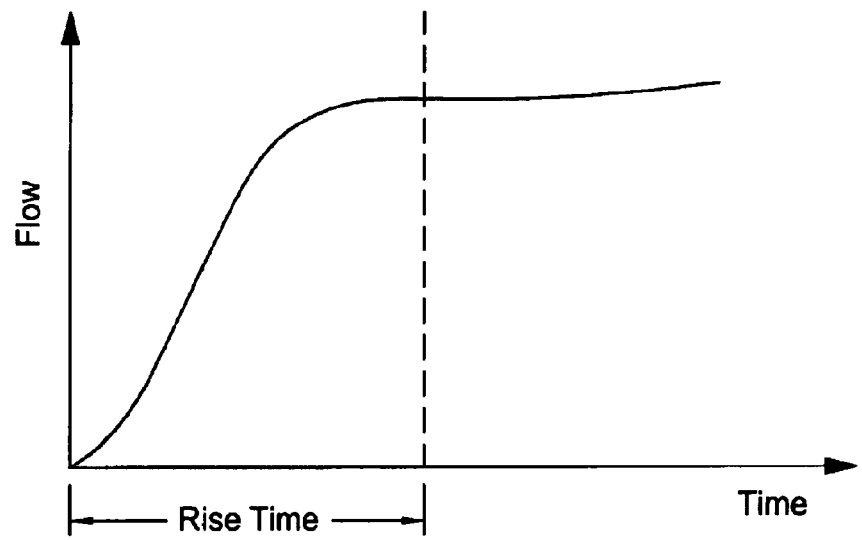
FIG. 1 is a graphical illustration showing the standard flow response of vaporized liquid of a typical liquid injection system.
Figure 4:
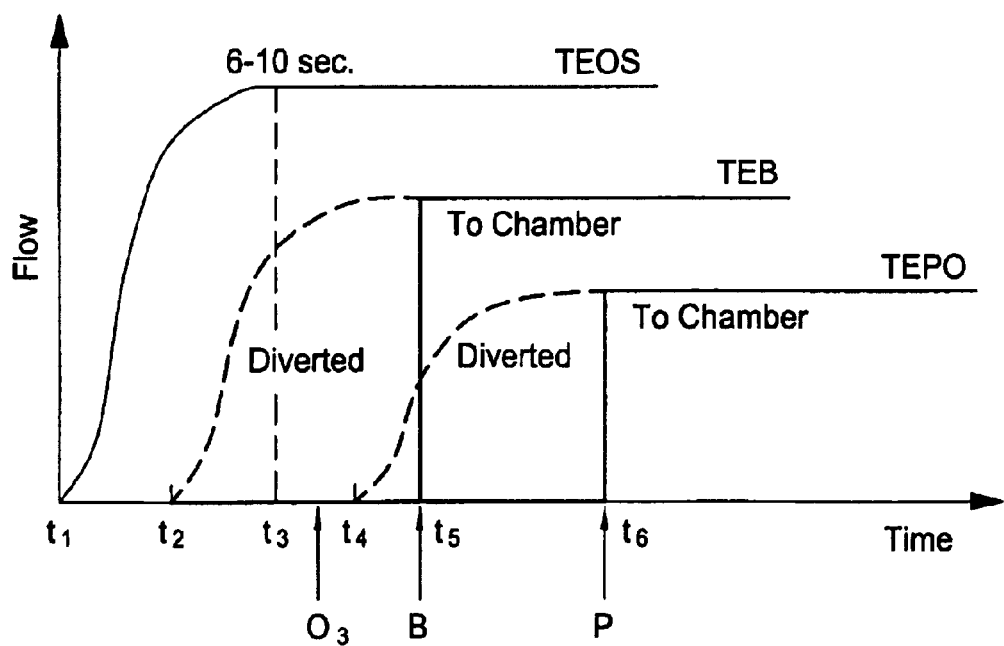
FIG. 4 is a graphical illustration of an example process for depositing a silicon oxide film having step-wise dopant concentration onto a substrate in the chamber utilizing one embodiment of the individual divert gas delivery system as shown in FIG. 2.

FIG. 4 is a graphical illustration of an example process for depositing a silicon oxide film having step-wise dopant concentration onto a substrate in the chamber utilizing one embodiment of the individual divert gas delivery system as shown in FIG. 2. The liquid precursors include TEOS, TEB and TEPO, and three vaporizers are utilized, one vaporizer for each liquid precursor. As shown in FIG. 4, at $t_1$ liquid precursor TEOS is introduced (i.e., LFM opened) into a first vaporizer operating in divert mode until vaporization of liquid precursor TEOS is stabilized at $t_3$, typically in about 6–10 seconds. At $t_3$, the first vaporizer is switched to process mode to direct vaporized process gas containing vaporized TEOS into the chamber to form a layer of film on a substrate in the chamber. At $t_2$, the liquid precursor TEB is introduced into a second vaporizer operating in divert mode until vaporization of liquid precursor TEB is stabilized at $t_5$, typically in about 6–10 seconds. At $t_5$, the second vaporizer is switched to process mode to direct vaporized process gas containing vaporized TEB into the chamber to dope the silicon oxide film with boron. At $t_4$ liquid precursor TEPO is introduced into a third vaporizer operating in divert mode until vaporization of liquid precursor TEPO is stabilized at $t_6$, typically in about 6–10 seconds. At $t_6$, the third vaporizer is switched to process mode to direct vaporized process gas containing vaporized TEPO into the chamber to dope the silicon oxide film with phosphorus in addition to the boron dopant to form BPSG.

By diverting vaporized output from the vaporizers until liquid flow into the vaporizer is stabilized, the gas delivery system reduces the response time for precursor gases, including dopants, from about 6–10 seconds to substantially instantaneous (i.e., the time required to flip a three-way pneumatic valve). Thus, the invention provides precise control of film content, and particularly for processes having short deposition time as compared to rise time of LFMs, the invention provides consistent and repeatable deposition results that are unaffected by rise time of LFMs.

Figure 5:
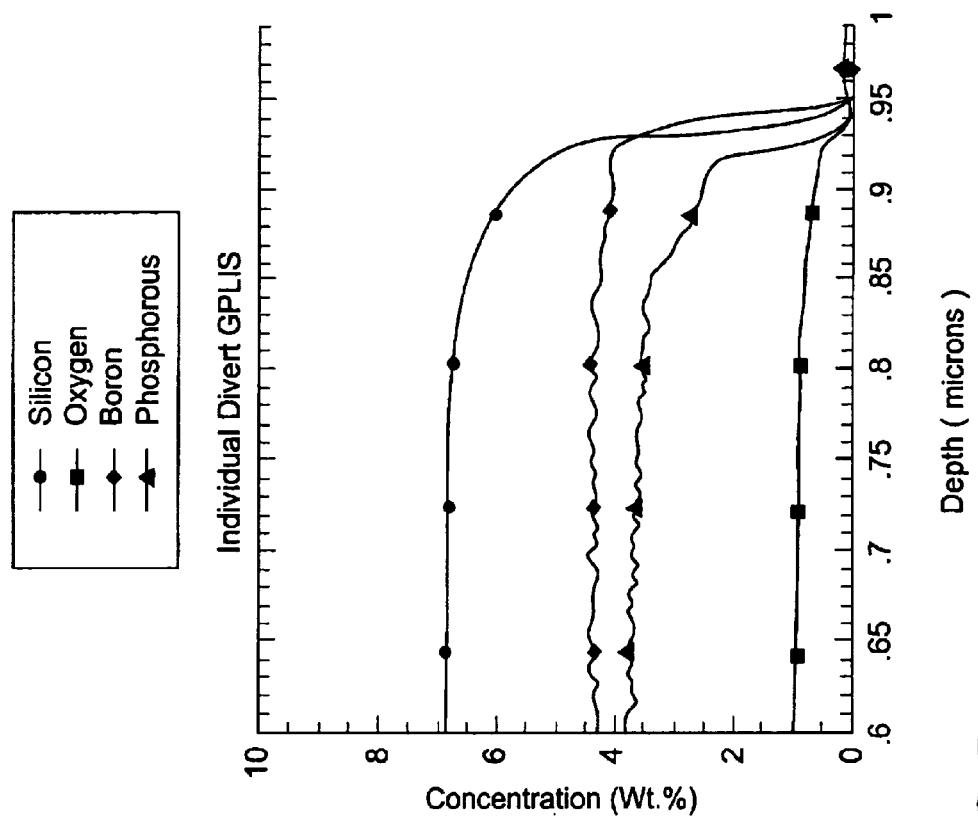
FIG. 5 is a graphical illustration of a comparison of SIMS analysis for dopant profile changes for a film formed utilizing a typical standard gas delivery system and a film formed utilizing an individual divert gas delivery system.
Figure 5:
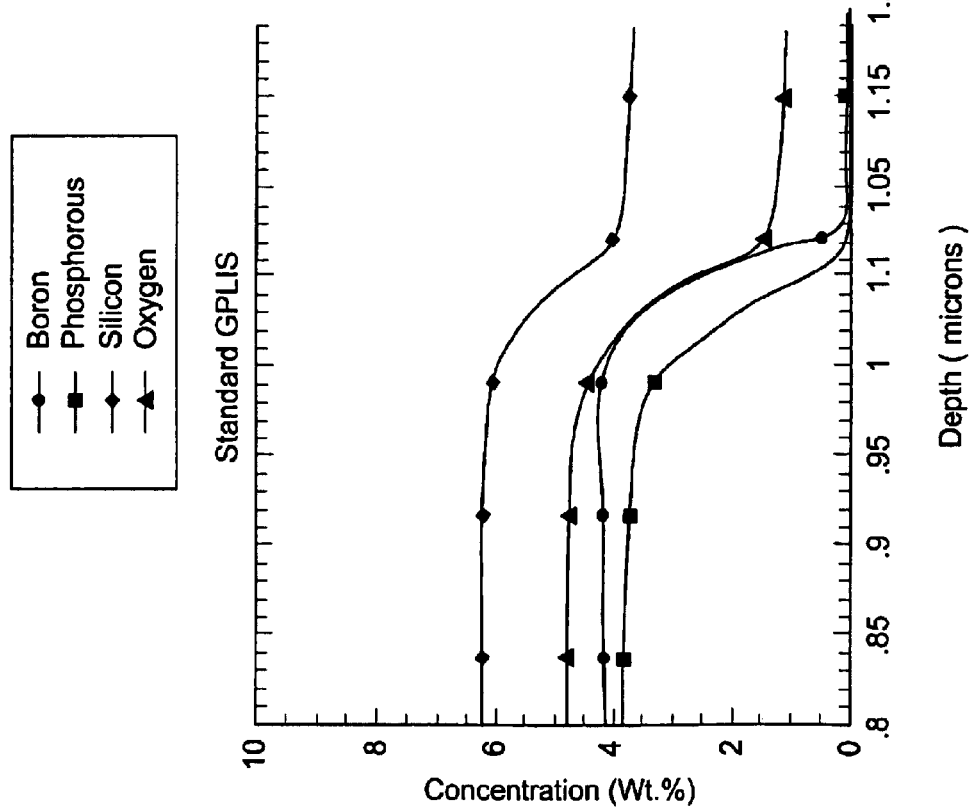

FIG. 5 is a graphical illustration of a comparison of SIMS analysis for dopant profile changes for a film formed utilizing a typical standard gas delivery system and a film formed utilizing an individual divert gas delivery system. The contents of a BPSG film is analyzed with respect to the depth of film. As shown in FIG. 5, a film formed utilizing the individual divert gas delivery system provides a steeper slope for dopant concentration profile as compared to the standard gas delivery system, indicating better dopant profile control provided by the individual divert gas delivery system.

The individual divert gas delivery system is capable of providing vaporized precursors into a process chamber without the rise time effects or concentration gradient typically associated with LFMs that control flow of liquid precursors into vaporizers. Also, the individual divert gas delivery system is capable of providing precise dopant concentration into a processing chamber for forming films having dopant content, such as BSG, PSG, BPSG, and other doped films. The liquid precursor for the dopant can be introduced into a vaporizer in divert mode for a preset time period sufficient for stabilized vaporization of the dopant precursor, typically 6–10 seconds, before the dopant is needed in the process chamber. Thus, when the dopant is needed and introduced into the chamber, the dopant vaporization is stabilized, and the resulting doped film exhibits substantially step-wise dopant concentration profiles.

Another advantage is that the individual divert gas delivery system can be easily retrofitted (i.e., drop-in retrofit) onto current/existing serial and parallel PLIS systems. The individual divert gas delivery system also enables processing at constant chamber pressure while varying the precursor content in the processing gas.

While the foregoing is directed to the preferred embodiment of the present invention, other and further embodiments of the invention may be devised without departing from the basic scope thereof, and the scope thereof is determined by the claims that follow.

What is claimed is:

1. An apparatus for delivering processing gas from a vaporizer to a processing system, comprising:
   a valve connected between the vaporizer and the processing system, the valve having a valve input connectedto a vaporizer output anda first valve output connected to a processing system input and a second valve output connected to a bypass line;
   a controller for switching the valve between the first valve output and the second valve output; and
   a second valve connected between a carrier gas source, a divert gas source and the vaporizer, the second valve having a first valve input connected to the carrier gas source, a second valve input connected to the divert gas source, and a valve output connected to a vaporizer input.

2. The apparatus of claim 1, wherein the controller is connected to switch the second valve between the first valve input and the second valve input.

3. The apparatus of claim 2, wherein the controller is connected to correspondingly switch the first valve and the second valve.

4. An apparatus for processing a substrate, comprising:
   a chamber having a gas input;
   a vaporizer;
   a valve connected between the vaporizer and the chamber, the valve having a valve input connected to a vaporizer output and a first valve output connected to the gas input and a second valve output connected to a bypass line;
   a controller for switching the valve between the first valeve output and the second valve output; and
   a second valve connected between a carrier gas source, a divert gas source and the vaporizer, the second valve having a first valve input connected to the carrier gas source, a second valve input connected to the divert gas source, and a valve output connected to a vaporizer input.

5. An apparatus for processing a substrate, comprising:
   a chamber having a gas input;
   a vaporizer;
   a valve connected between the vaporizer and the chamber, the valve having a valve input connected to a vaporizer output and a first valve output connected to the gas input and a second valve output connected to a bypass line;
   a controller for switching the valve between the first valve output and the second valve output; and
   at least one intermediate valve connected between the gas source and the valve.

6. The apparatus of claim 5, wherein the controller is connected to switch the input valve between a first valve input of the plurality of inputs and a second valve input of the plurality of inputs.

7. The apparatus of claim 6, wherein the controller is connected to correspondingly switch the valve and the input valve.

8. An apparatus for processing a substrate, comprising:
   a chamber having a gas input;
   a vaporizer;
   a valve connected between the vaporizer and the chamber, the valve having a valve input connected to a vaporizer output and a first valve output connected to the gas input and a second valve output connected to a bypass line;

a controller for switching the valve between the first valve output and the second valve output; and at least one intermediate valve connected between the gas source and the valve.

9. The apparatus of claim 5, further comprising:

at least one input valve connected between a gas source and the valve, the input valve having a plurality of inputs selectably connected to a plurality of gas supplies of the gas source and an output connected to the input.

10. The apparatus of claim 9, wherein the controller means is connected to correspondingly switch the valve means and the second valve means.

* * * * *

UNITED STATES PATENT AND TRADEMARK OFFICE
CERTIFICATE OF CORRECTION

PATENT NO. : 7,011,710 B2
APPLICATION NO. : 09/832168
DATED : March 14, 2006
INVENTOR(S) : Won Bang, Yen Kun Wang and Yeh Jen Kao It is certified that error appears in the above-identified patent and that said Letters Patent is hereby corrected as shown below:

Column 8, Claim 1, Line 5: Replace "connectedto" with --connected to--

Column 8, Claim 1, Line 6: Replace "anda" with --and a--

Column 8, Claim 4, Line 32: Replace "valeve" with --valve--

Column 8, Claim 5, Line 49: Please replace:

"at least one intermediate valve connected between the gas source and the valve."

with the following:

--at least one input valve connected between a gas source and the valve, the input valve having a plurality of inputs selectably connected to a plurality of gas supplies of the gas source and an output connected to the valve input.--

Column 8, Claim 8: Please replace the claim with the following:

--An apparatus for delivering processing gas from a vaporizer to a processing system, comprising:
a valve means for selectively delivering gas to a processing system input and to a bypass line, the valve means being connected between the vaporizer and the processing system, wherein the valve means comprises a valve having a valve input connected to a vaporizer output and a first valve output connected to the processing system input and a second valve output connected to the bypass line;
a controller means for switching the valve means between the processing system input and to the bypass line; and
a second valve means connected between a carrier gas source, a divert gas source and the vaporizer, the second valve means having a first valve input connected to the carrier gas source, a second valve input connected to the divert gas source, and a valve output connected to a vaporizer input.--

UNITED STATES PATENT AND TRADEMARK OFFICE
CERTIFICATE OF CORRECTION

PATENT NO. : 7,011,710 B2
APPLICATION NO. : 09/832168
DATED : March 14, 2006
INVENTOR(S) : Won Bang, Yen Kun Wang and Yeh Jen Kao It is certified that error appears in the above-identified patent and that said Letters Patent is hereby corrected as shown below:

Column 9, Claim 9: Please replace the claim with the following:

--The apparatus of claim 19 wherein the controller means is connected to switch the second valve means between the first valve input and the second valve input.--

Signed and Sealed this

Third Day of October, 2006

JON W. DUDAS
*Director of the United States Patent and Trademark Office*